United States Patent
Fujimaki et al.

(10) Patent No.: US 12,199,179 B2
(45) Date of Patent: Jan. 14, 2025

(54) LDMOS WITH POLYSILICON DEEP DRAIN

(71) Applicant: Powerchip Semiconductor Manufacturing Corporation, Hsinchu (TW)

(72) Inventors: Hirokazu Fujimaki, Hsinchu (TW); Bo-An Tsai, Hsinchu (TW); Shih-Ping Lee, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 244 days.

(21) Appl. No.: 17/491,484

(22) Filed: Sep. 30, 2021

(65) Prior Publication Data
US 2022/0406933 A1   Dec. 22, 2022

(30) Foreign Application Priority Data

Jun. 18, 2021  (TW) ................................. 110122309
Sep. 2, 2021   (TW) ................................. 110132665

(51) Int. Cl.
| | |
|---|---|
| H01L 29/78 | (2006.01) |
| H01L 29/04 | (2006.01) |
| H01L 29/06 | (2006.01) |
| H01L 29/08 | (2006.01) |
| H01L 29/10 | (2006.01) |
| H01L 29/417 | (2006.01) |
| H01L 29/66 | (2006.01) |

(52) U.S. Cl.
CPC .......... *H01L 29/7816* (2013.01); *H01L 29/04* (2013.01); *H01L 29/0634* (2013.01); *H01L 29/0878* (2013.01); *H01L 29/1095* (2013.01); *H01L 29/41766* (2013.01); *H01L 29/66492* (2013.01); *H01L 29/66681* (2013.01); *H01L 29/7824* (2013.01); *H01L 29/7833* (2013.01)

(58) Field of Classification Search
CPC .................................................... H01L 29/7816
See application file for complete search history.

(56) References Cited

U.S. PATENT DOCUMENTS

| | | | |
|---|---|---|---|
| 2003/0071320 A1* | 4/2003 | Kocon | ................... H01L 29/407 |
| | | | 257/487 |
| 2017/0213894 A1 | 7/2017 | Mallikarjunaswamy | |
| 2019/0131296 A1 | 5/2019 | Murukesan | |
| 2019/0181237 A1* | 6/2019 | Xia | ..................... H01L 29/0653 |
| 2020/0266287 A1* | 8/2020 | Fang | ................... H01L 29/7835 |

OTHER PUBLICATIONS

Jim Plummer, et. al Silicon VLSI Technology, 2000, Prentice Hall, First Edition, p. 17 (Year: 2000).*

* cited by examiner

*Primary Examiner* — Tucker J Wright
(74) *Attorney, Agent, or Firm* — Winston Hsu

(57) ABSTRACT

A semiconductor structure, the semiconductor structure includes a substrate with a first conductivity type and a laterally diffused metal-oxide-semiconductor (LDMOS) device on the substrate, the LDMOS device includes a first well region on the substrate, and the first well region has a first conductivity type. A second well region with a second conductivity type, the second conductivity type is complementary to the first conductivity type, a source doped region in the second well region with the first conductivity type, and a deep drain doped region in the first well region, the deep drain doped region has the first conductivity type.

7 Claims, 8 Drawing Sheets

LDMOS WITH POLYSILICON DEEP DRAIN

BACKGROUND OF THE INVENTION

1. Field of the Invention

The present invention relates to a semiconductor structure, in particular to a laterally diffused metal-oxide-semiconductor (LDMOS) device and a manufacturing method thereof.

2. Description of the Prior Art

The laterally diffused metal-oxide-semiconductor (LDMOS) device is a common power semiconductor device. Because the laterally diffused metal-oxide-semiconductor device has a horizontal structure, it is easy to manufacture and integrate with the current semiconductor technology, thus reducing the manufacturing cost. At the same time, it can withstand high breakdown voltage and has high output power, so it is widely used in power converter, power amplifier, switch, rectifier and other components.

However, because LDMOS and other components usually have a large area, they also occupy about half of the entire semiconductor structure. Therefore, how to improve the device structure and reduce the area of LDMOS will be one of the research directions in the field.

SUMMARY OF THE INVENTION

The invention provides a semiconductor structure, which comprises a substrate with a first conductivity type, a laterally diffused metal-oxide-semiconductor (LDMOS) device on the substrate, wherein the LDMOS device comprises a first well region on the substrate, and the first well region has a first conductivity type. And a second well region, the second well region has a second conductivity type, which is complementary to the first conductivity type, a source doped region in the second well region with the first conductivity type, and a deep drain doped region in the first well region The invention also provides a method for forming a semiconductor structure, which comprises providing a substrate with a first conductivity type, forming a laterally diffused metal-oxide-semiconductor (LDMOS) device on the substrate, wherein the LDMOS device comprises forming a first well region on the substrate, the first well region has a first conductivity type, forming a second well region in the first well region, wherein the upper and lower surfaces of a part of the second well region are surrounded by the first well region, wherein the second well region has a second conductivity type, wherein the second conductivity type is complementary to the first conductivity type, forming a source doped region located in the second well region and having the first conductivity type; and filling a doped polysilicon material into the groove to form a deep drain doped region in the first well region, wherein the deep drain doped region has the first conductivity type.

The feature of the present invention is to provide a reduced surface field laterally diffused MOSFET (referred to as RESURF LDMOS for short). In the forming process of RESURF LDMOS, a groove is formed in a first well region, and then a polysilicon material with high doping concentration is filled in the groove to form a deep drain doped region in the first well region. Different from the conventional way of forming the drain doped region in the first well region by ion implantation and heating diffusion, the required area of the deep drain doped region is significantly reduced, so the total area of the device can also be reduced to achieve the miniaturization effect. In addition, the deep drain doped region has a high doping concentration, which is less likely to generate voltage drop, thus improving the product quality.

These and other objectives of the present invention will no doubt become obvious to those of ordinary skill in the art after reading the following detailed description of the preferred embodiment that is illustrated in the various figures and drawings.

DETAILED DESCRIPTION

In order to enable those who are familiar with the technical field of the present invention to further understand the present invention, the preferred embodiments of the present invention are listed below, and the composition and the desired effects of the present invention are described in detail in conjunction with the attached drawings.

For convenience of explanation, the drawings of the present invention are only schematic to make it easier to understand the present invention, and the detailed scale can be adjusted according to the design requirements. As for the up-down relationship of relative elements in the figure described in this paper, people in the field should understand that it refers to the relative position of objects, so they can all be turned over to present the same components, which should belong to the scope disclosed in this specification, and be described here first.

Figure 1:
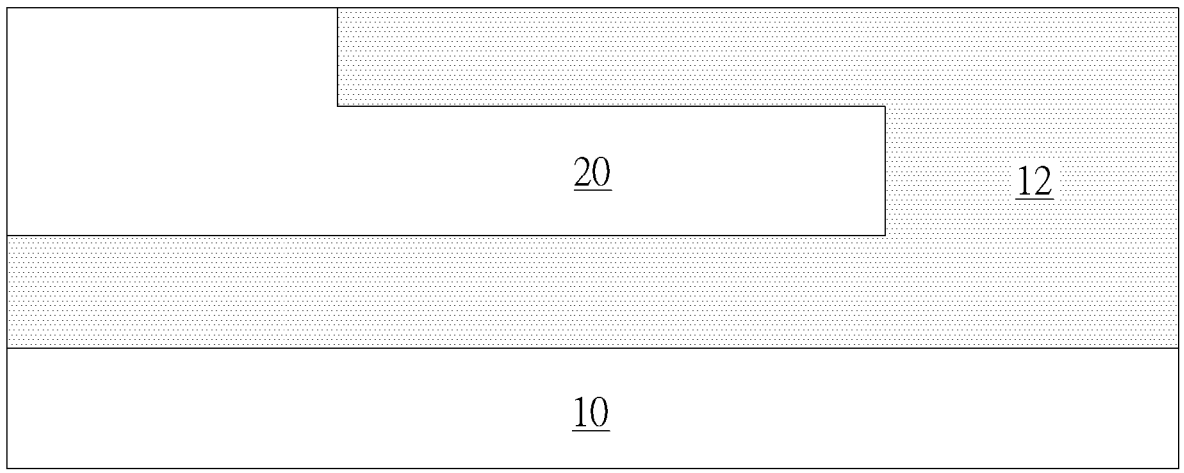
FIG. 1 to FIG. 7 show schematic diagrams of forming a reduced surface field laterally diffused MOSFET (referred to as RESURF LDMOS for short) according to the present invention.

With reference to FIGS. 1 to 7, FIGS. 1 to 7 show schematic diagrams of forming a reduced surface field laterally diffused MOSFET (referred to as RESURF LDMOS for short) in accordance with the present invention. As shown in FIG. 1, a substrate 10 is provided, and a first well region 12 and a second well region 20 are formed in the substrate 10 by doping. It is worth noting that the substrate 10 is, for example, a silicon substrate (single crystal silicon), and the first well region 12 is located on the substrate 10 and comprises a first conductivity type (e.g., N-type). The first well region 12 can comprise a barrier layer 14 and a drift region 16, which are connected with each other and have the same conductivity type (e.g., N-type). The second well region 20 includes a second conductivity type (e.g., P-type) complementary to the first conductivity type. In this embodiment, the substrate 10 is, for example, a P-type substrate.

It is worth noting that, as shown in FIG. 1, a part of the second well region 20 penetrates laterally into the first well region 12, and the upper and lower surfaces of the part of the second well region 20 are surrounded by the first well region 12, thereby forming a structure in which the first well region 12 and the second well region 20 are interlaced with each other. In other words, a part of the extension of the second well region 20 is located between the barrier layer 14 and the drift region 16 of the first well region 12. In the actual fabrication process, the barrier layer 14 may be formed on the substrate 10 first, and then the second well region 20 may be formed, and then a part of the second well region 20 may be doped with ions to form the drift region 16.

In the following steps, when the well region is made into the LDMOS devices, it is beneficial to form a depletion region at the N-P interface to block the current from passing through, so that the LDMOS can bear a larger voltage difference when it is turned off. Compared with the general LDMOS, this structure requires a smaller area, so the above LDMOS can also be referred to as a reduced surface field laterally diffused MOSFET (e.g. RESURF LDMOS, for short). Other introductions about RESURF LDMOS have been disclosed in some prior art (for example, U.S. Pat. No. 9,484,454), so they are not repeated here.

Figure 2:
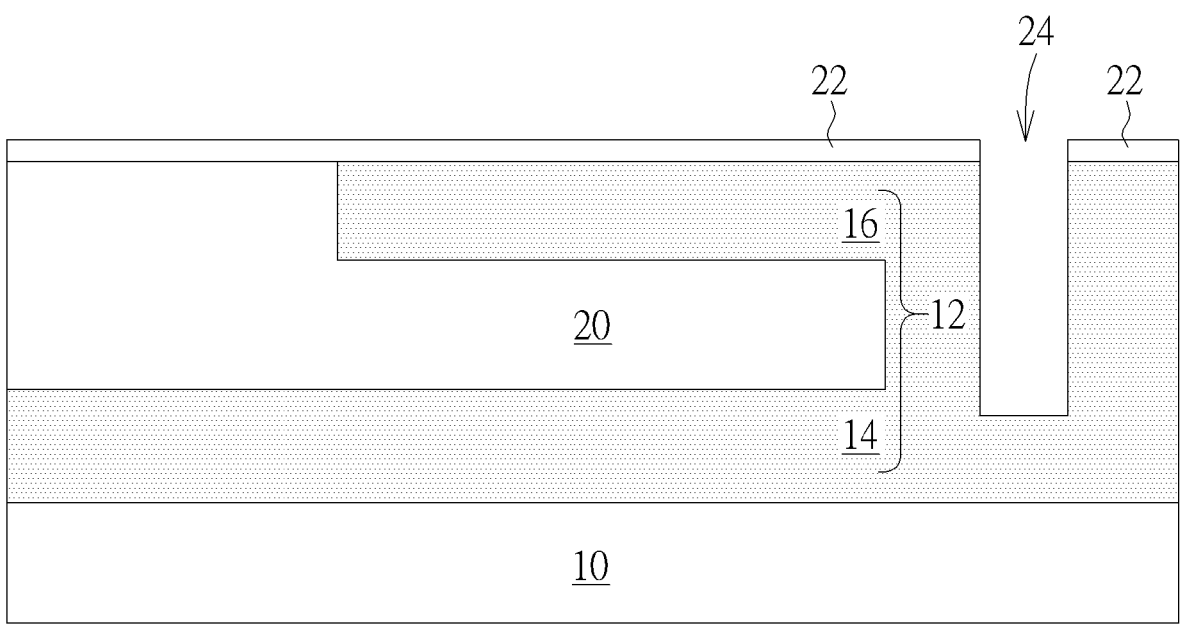

According to the invention, the structure of RESURF LDMOS is improved, so as to achieve the effects of reducing the device area and increasing the device quality. As shown in FIG. 2, a patterned insulating layer 22 is formed on the surfaces of the first well region 12 and the second well region 20, for example, but not limited to silicon oxide or silicon nitride. Then, using the insulating layer 22 as a mask, a groove 24 is formed in the first well region 12. For example, the groove 24 can be formed by patterning and etching, but is not limited to this. In addition, in this embodiment, the width of the groove 24 is preferably less than 0.5 micrometers and the depth is more than 8 micrometers, but it is not limited to this. In this embodiment, the width of the groove 24 is about 0.3 micrometers, and the depth is preferably larger than the interface between the barrier layer 14 and the second well region 20.

Figure 3:
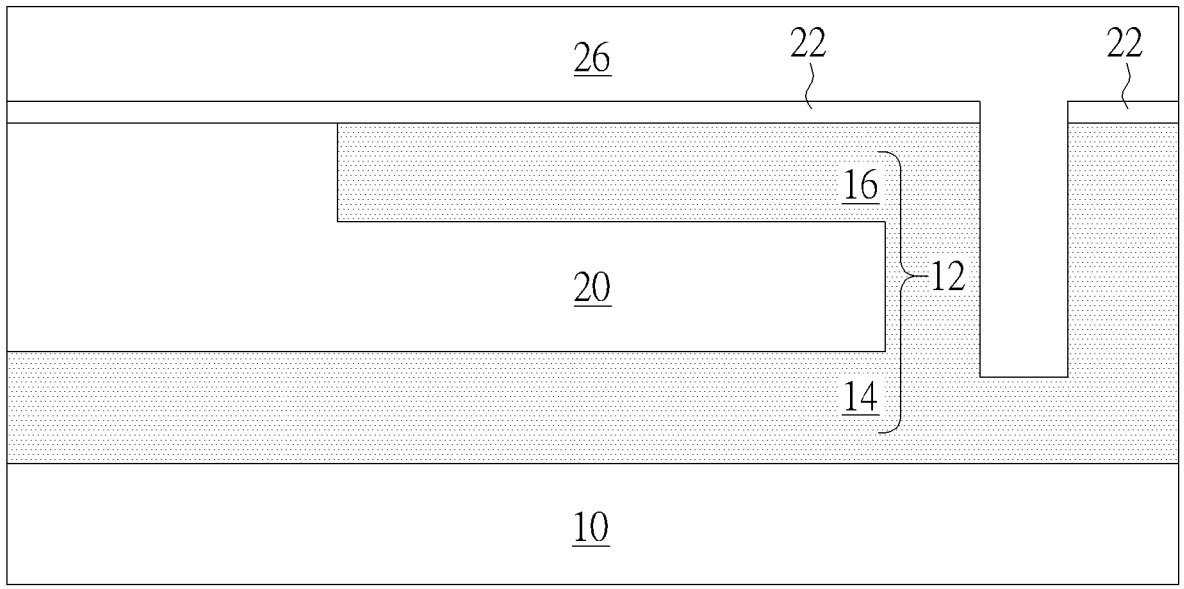

Then, as shown in FIG. 3, a polysilicon layer 26 is formed to fill the groove 24, the polysilicon layer 26 is, for example, a polysilicon layer with high doping concentration, which can be formed by an in-situ doping process and has a first conductivity type (e.g., N-type). In this embodiment, the concentration of polysilicon layer 26 is preferably greater than 1E18 $cm^3$, which is higher than that of doped regions formed by ion implantation and heating in conventional steps.

Figure 4:
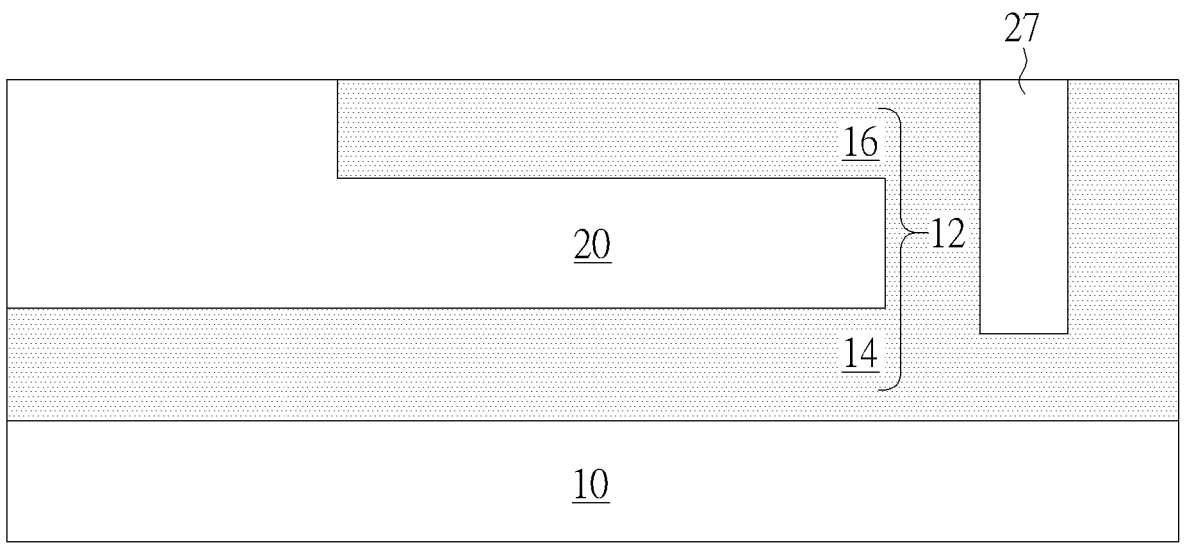

Then, as shown in FIG. 4, the redundant polysilicon layer 26 and insulating layer 22 are removed by etching back or chemical mechanical polishing (CMP) to expose the surfaces of the first well region 12 and the second well region 20. Here, the polysilicon layer 26 remaining in the groove 24 can also be defined as deep drain doped region 27, and its function will be described in the following paragraphs.

Figure 5:
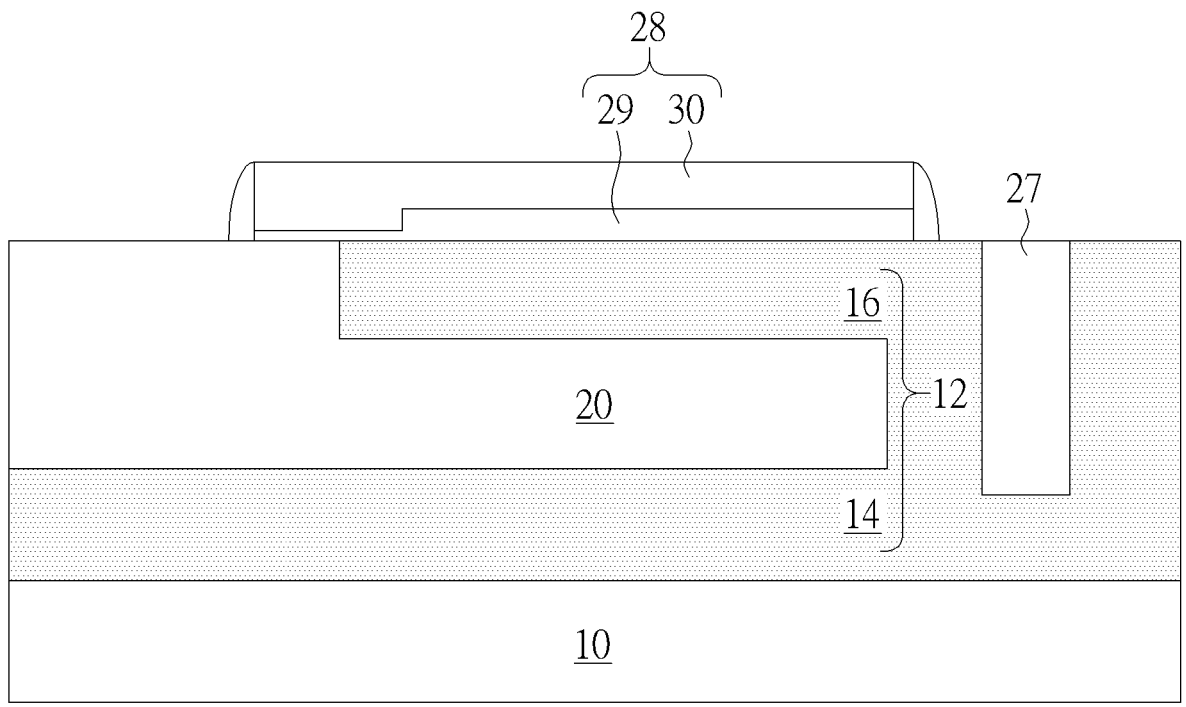

As shown in FIG. 5, a gate structure 28 is formed on the first well region 12 and the second well region 20, wherein the gate structure 28 includes a gate dielectric layer 29 and a gate conductive layer 30, wherein region of the gate dielectric layer 29 which is disposed above the drift region 16 is thicker, and region of the gate dielectric layer 29 which is near the interface between the surfaces of the first well region 12 and the second well region 20 is thinner. The above-mentioned gate structure 28 belongs to the conventional technology of RESURF LDMOS, and other features will not be described in detail.

Figure 6:
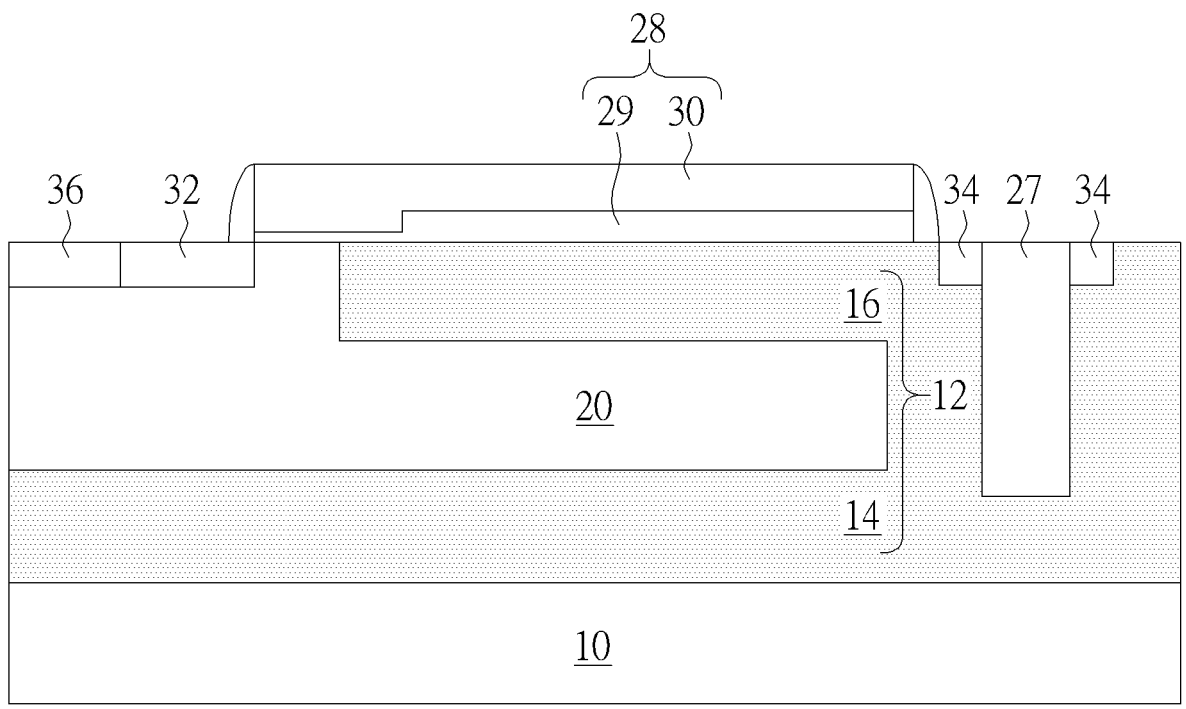

With continued reference to FIG. 6, after the gate structure 28 is completed, at least a source doped region 32 and a shallow drain doped region 34 are formed in the first well region 12 and the second well region 14 by ion doping and heating steps, respectively. The source doped region 32 and the shallow drain doped region 34 both contain the first conductivity type (e.g., N-type), and the shallow drain doped region 34 is connected with the deep drain doped region 27. It is worth noting that since the source doped region 32 and the shallow drain doped region 34 are formed in the well region composed of single crystal silicon by the steps of ion doping and heating, the material is also single crystal silicon, and the material is different from that of the deep drain doped region 27. In addition, in this embodiment, the ion doping concentration of the source doped region 32 and the shallow drain doped region 34 is greater than 1E20 $cm^3$, for example. In addition, in some embodiments, a body region 36 may be additionally formed beside the source doped region 32, wherein the body region 36 is, for example, a doped region containing a second conductivity type (e.g., P-type).

Figure 7:
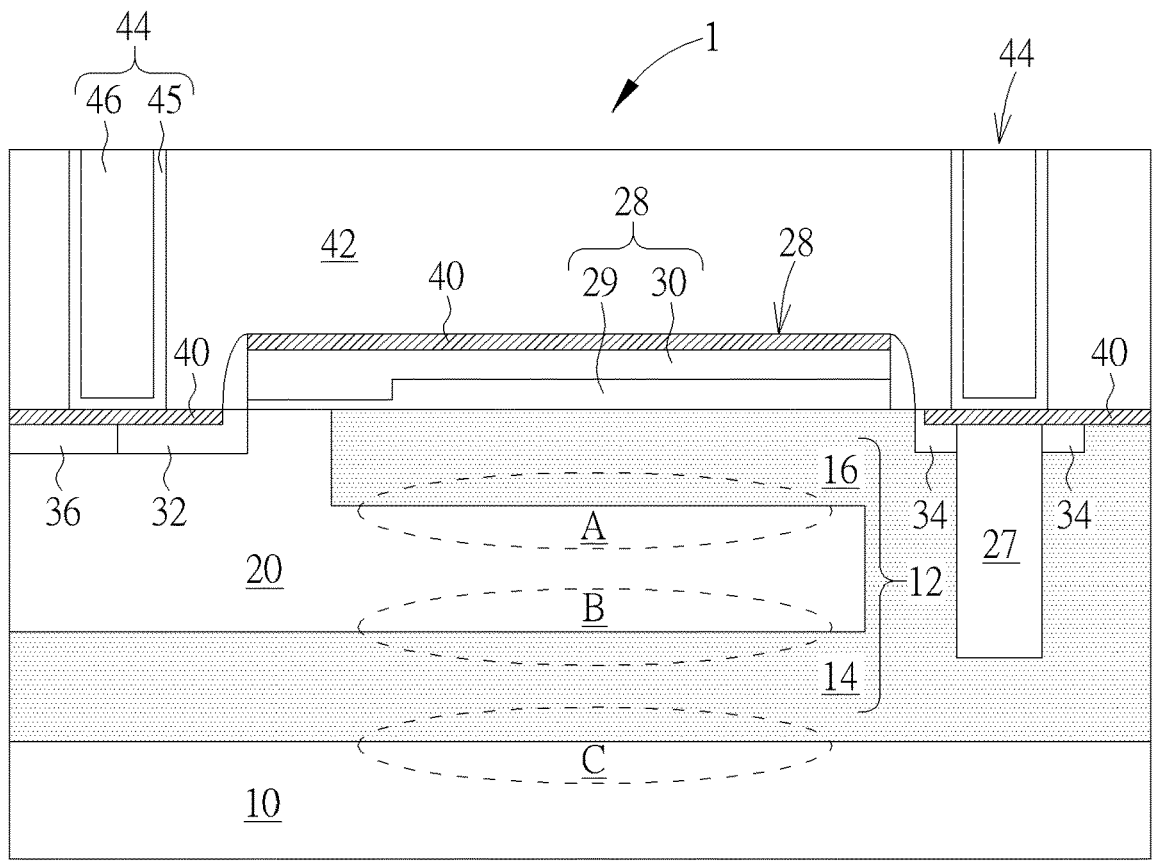

As shown in FIG. 7, a silicide layer 40 can be selectively formed on the surfaces of the gate structure 28, the first well region 12 and the second well region 20. Then, a dielectric layer 42 is formed to cover the above devices, and a plurality of contact structures 44 are formed in the dielectric layer 42, which are connected to the source doped region 32 and the shallow drain doped region 34. In some embodiments, the silicide layer 40 may be omitted or formed under the contact structure 44 after the dielectric layer 42 is completed. The dielectric layer 42 is silicon oxide or silicon nitride, and the contact structure 44 may include a liner layer 45 made of titanium/titanium nitride, and a conductive layer 46 made of tungsten (W). Other details and manufacturing methods of the above components belong to the conventional technology in the field, and will not be described in detail here. So far, the RESURF LDMOS structure 1 of the present invention has been completed. The first well region 12 of the RESURF LDMOS structure 1 in this embodiment is N-type, so the RESURF LDMOS structure 1 in this embodiment can be defined as an N-type RESURF LDMOS structure.

In the RESURF LDMOS structure 1 of the present invention, when the gate structure 28 is closed, there is still a potential difference between the source terminal and the drain terminal. For example, a high voltage (e.g., 100V) is introduced into the contact structure 44 above the drain terminal, while the source terminal maintains a potential of 0. At this time, due to the high doping concentration and good conductivity of the deep drain doped region 27, the voltage conducted to the lower side is only slightly reduced. The voltage will keep the first well region 12 at a high potential and the second well region 20 at a low potential, so that the N-P interface at the central part of the RESURF LDMOS structure 1 will generate a depletion region. For example, the areas A, B and C in FIG. 7 are all areas where depletion regions may occur. That is to say, when the gate structure 28 of the RESURF LDMOS structure 1 is closed, in addition to the isolation caused by the closing of the channel region, the depletion region generated in the center can further isolate the current, so that RESURF LDMOS structure 1 can withstand the high voltage operation mode.

Figure 8:
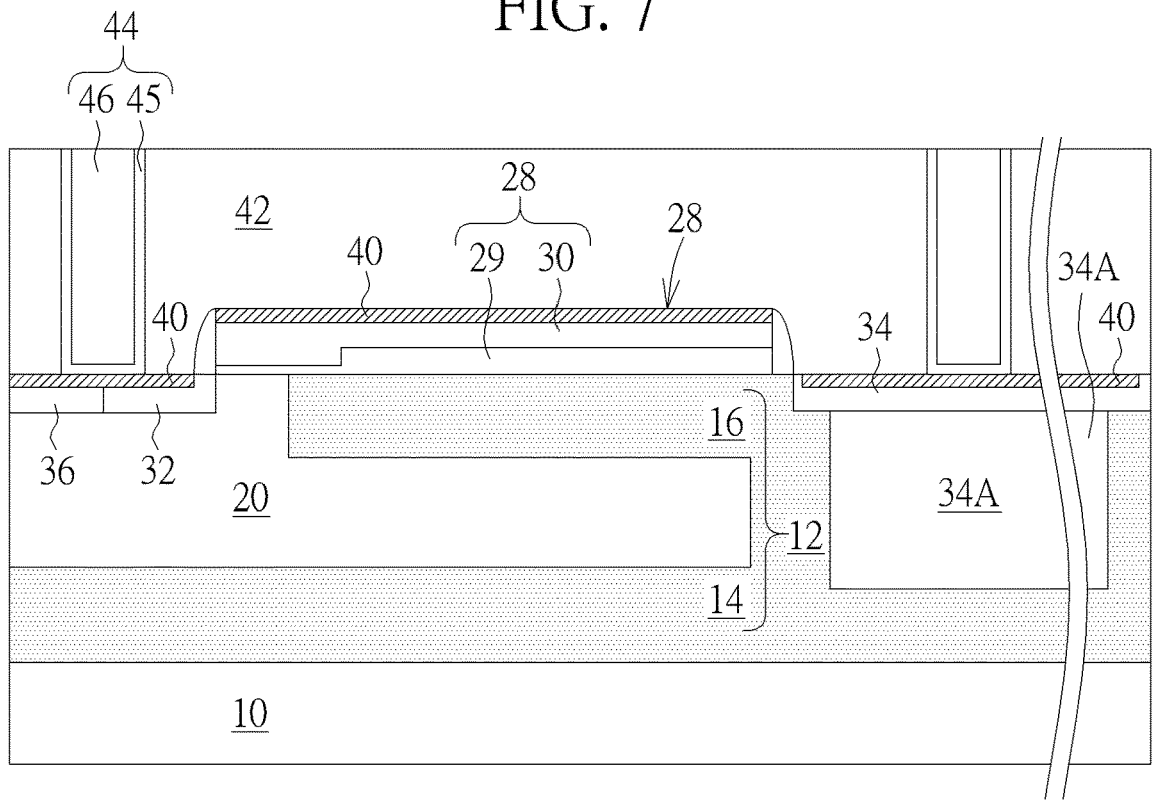
FIG. 8 shows a schematic structure of a RESURF LDMOS with a drain doped region formed by ion implantation and heating.

In order to successfully form the depletion region, it is better to make the depth of the drain doped region deeper in the conventional technology, so that the voltage can be smoothly conducted to the lower part near the barrier layer 14 and the depletion region can be successfully generated. FIG. 8 shows a schematic structure of a RESURF LDMOS with a drain doped region formed by ion implantation and heating. In the prior art, the depth of the drain doped region is increased by ion implantation and heating. However, ions will diffuse laterally when heated. Therefore, the width of the drain doped region is larger in the prior art (such as the ion doped region 34A in FIG. 8), which will lead to the large area of the device, which is not conducive to the miniaturization of the device. For example, if the depth of the ion doped region 34A reaches 8 micrometers in the conventional technology, its width will spread to about 12 micrometers. In addition, the doping concentration of the ion doped region 34A is not as good as that of the deep drain doped region 27 of the present invention, so the conductivity is not as good as that of the deep drain doped region 27. When a high voltage (e.g., 100V) is introduced from above the ion-doped region 34A, the voltage conducted below the ion-doped region 34A will drop more, which is not conducive to the formation of the depletion region.

The RESURF LDMOS structure 1 of the present invention is different from the RESURF LDMOS structure in the prior art in that the deep drain doped regions 27 are formed to replace part of the ion doped regions, and the deep drain doped regions 27 are formed by etching grooves 24 and backfilling polysilicon layers 26. The width of the groove 24 can be much smaller than that of the ion-doped region 34A in the prior art, and another feature is that the groove 24 is filled with a polysilicon layer 26 with higher doping concentration and better conductivity, which not only significantly reduce the device area (because the width of the polysilicon drain-doped plug 27 is smaller), but also has better conductivity, so that the high voltage from the upper contact structure 44 can be conducted to the polysilicon drain-doped plug 27. In a word, the present invention has the advantages of reducing device area, improving device quality and being compatible with the existing process.

Figure 9:
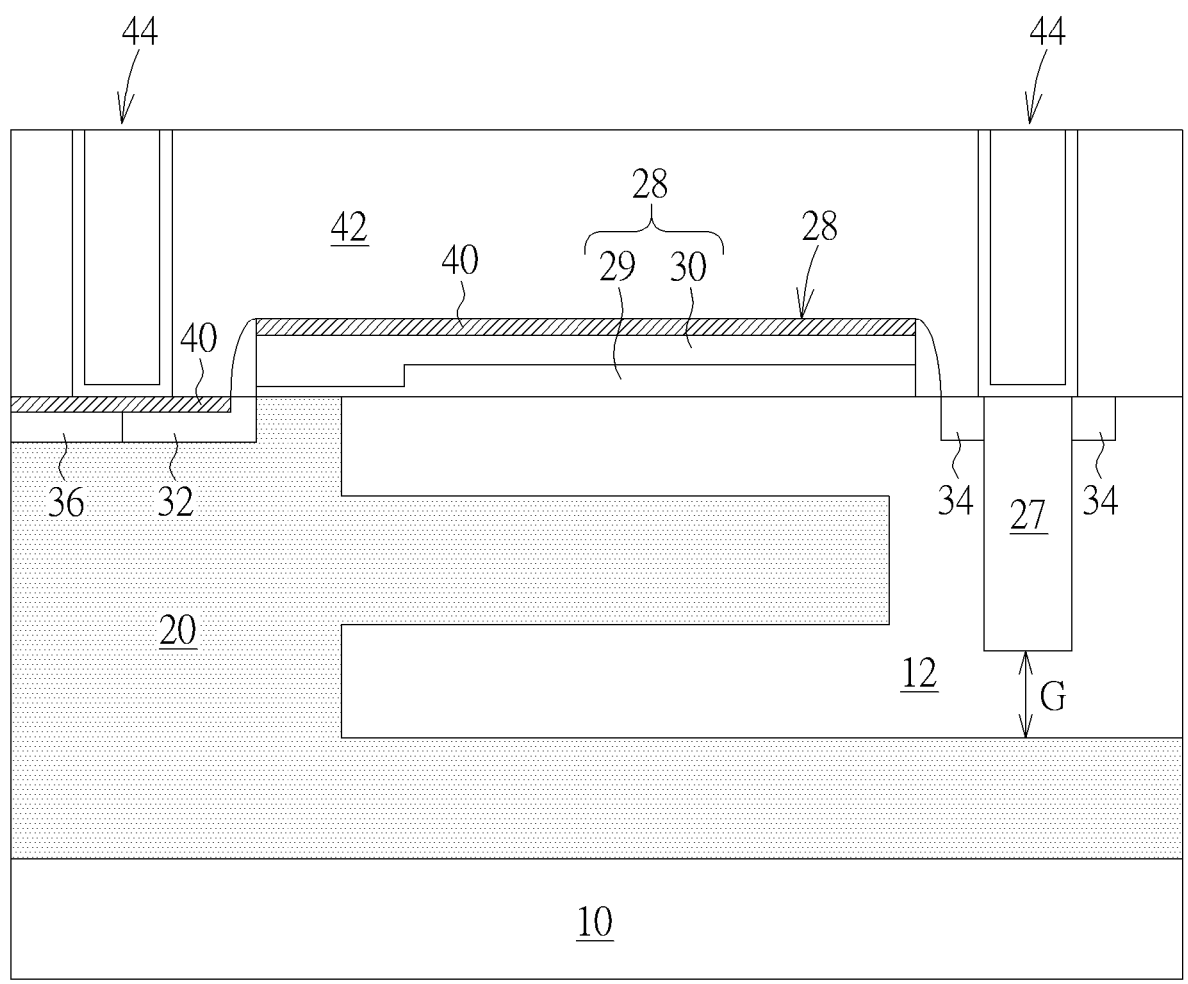
FIG. 9 shows the structure of a P-type RESURF LDMOS.

In the above embodiments (FIG. 1 to FIG. 7), taking the fabrication of N-type RESURF LDMOS structure as an example, that is, the first well region 12 and deep drain doped region 27 are N-type, and the second well region 20 is P-type. However, in other embodiments of the present invention, a P-type RESURF LDMOS structure can also be fabricated. As shown in FIG. 9, FIG. 9 shows a schematic structure diagram of a P-type RESURF LDMOS. The structures, materials and fabrication methods of most devices are the same as those of the first preferred embodiment, and are not described in detail. The difference from the above embodiment is that the substrate 10, the first well region 12, the deep drain doped region 27, the source doped region 32 and the shallow drain doped region 34 are P-type, while the second well region 20 and the body region 36 are N-type. It is worth noting that in this embodiment, the polysilicon drain-doped plug 27 does not contact the second well region 20, and a distance G is maintained between the polysilicon drain-doped plug 27 and the second well region 20, so as to avoid the device breakdown caused by current punch through between the polysilicon drain-doped plug 27 with higher doping concentration and the second well region 20 with lower doping concentration when a high potential is introduced at the drain terminal.

Figure 10:
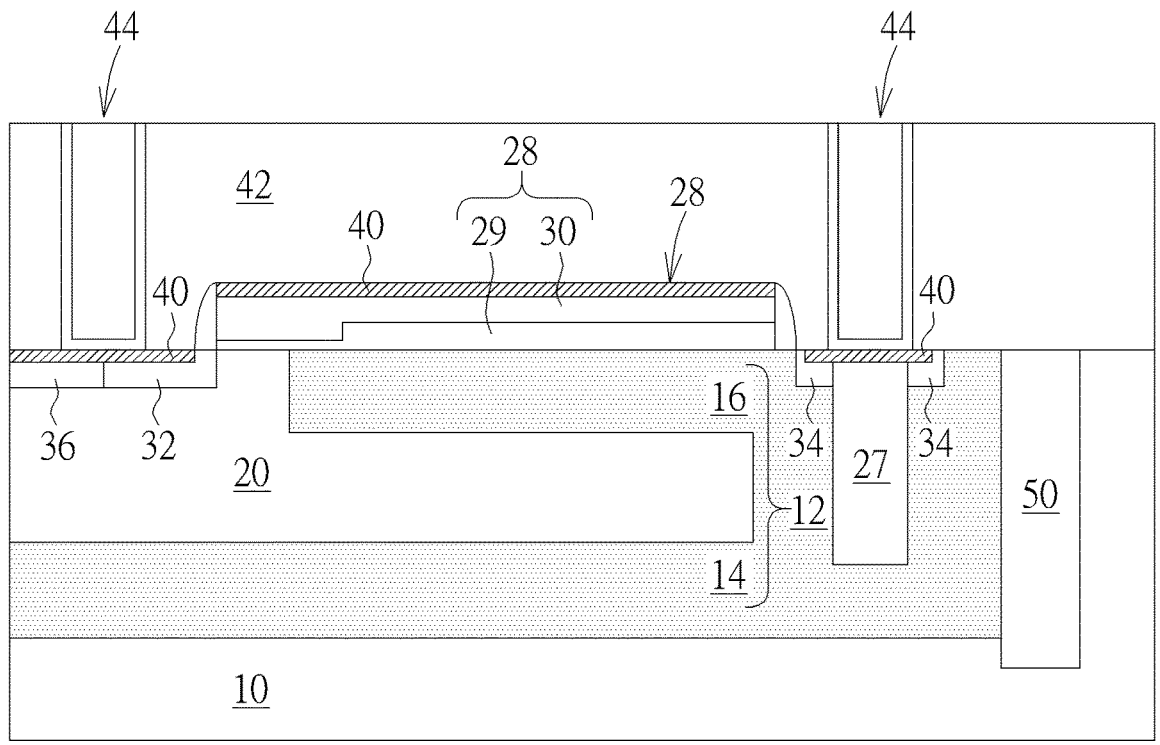
FIGS. 10-11 respectively show structural schematic diagrams of two RESURF LDMOS according to two other embodiments of the present invention.

Similarly, in other embodiments of the present invention, in order to avoid lateral current breakdown, an insulating layer may be provided beside or below the deep drain doped region 27. Please refer to FIGS. 10-11, which respectively show structural schematic diagrams of RESURF LDMOS according to two other embodiments of the present invention. As shown in FIG. 10, in this embodiment, an insulating layer 50 is additionally formed beside the deep drain doped region 27. the insulating layer 50 is, for example, silicon oxide or a polysilicon layer whose periphery is surrounded by silicon oxide. The depth of the insulating layer 50 may be deeper than that of the deep drain doped region 27, and the insulating layer 50 is disposed in the substrate 10 beside the first well region 12. In some embodiments, deep trench isolation (DTI) may be used as the insulating layer 50 here. The insulating layer 50 has the function of preventing the deep drain doped region 27 from penetrating the first well region 12 and affecting other adjacent devices.

Figure 11:
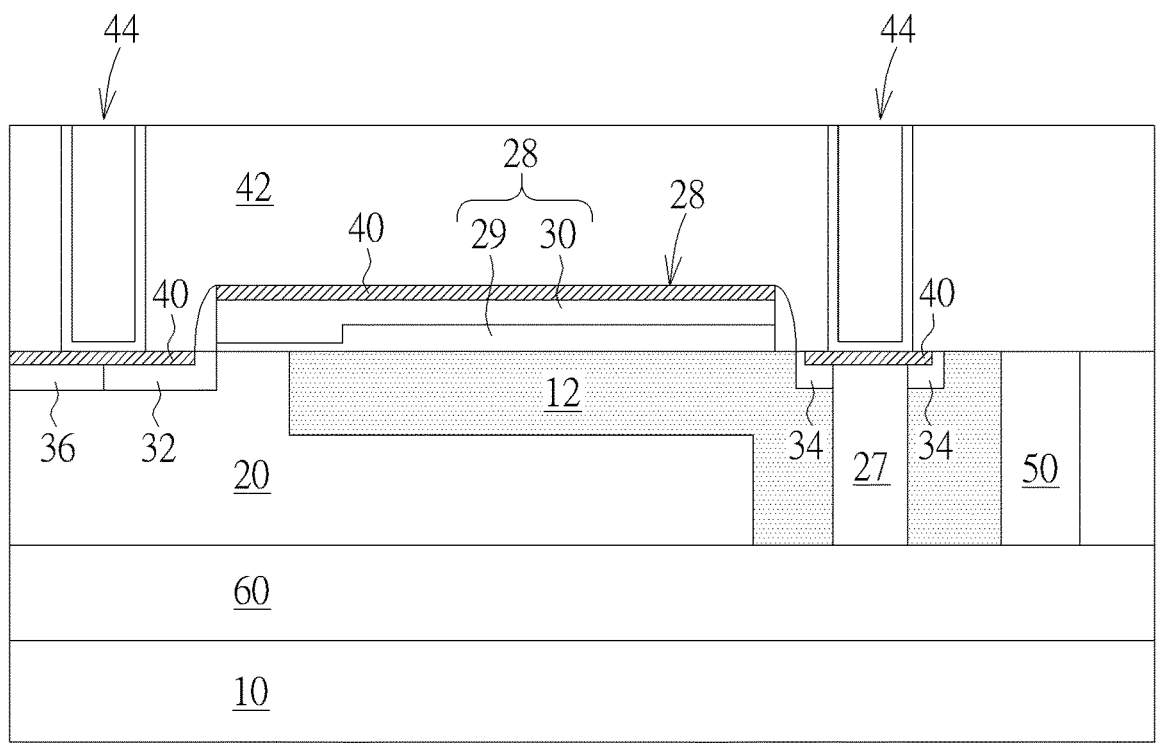

In another embodiment, as shown in FIG. 11, in addition to the above-mentioned insulating layer 50, part of the barrier layer 14 is replaced by another insulating layer 60 in this embodiment. The insulating layer 60 is, for example, silicon oxide. In some embodiments, a silicon on substrate (SOI) substrate can be used instead of the original silicon substrate to achieve the structure shown in FIG. 11. In this embodiment, the insulating layer 60 can also prevent current breakdown in the longitudinal direction.

In other embodiments of the present invention, different LDMOS can also be formed on the same substrate. For example, an N-type RESURF LDMOS (structure shown in FIG. 7) and a P-type RESURF LDMOS (structure shown in FIG. 9) can be formed on different regions of one substrate. This structure also falls within the scope of the present invention.

In the above embodiment, the groove 24 is filled with a polysilicon layer 26 with a high doping concentration, thereby forming a polysilicon deep drain doped region 27 with a narrow width. In addition, in other embodiments of the present invention, a deep drain doped region with narrow width and sufficient depth may be formed in the first well region 12 by doping or plasma implantation in the groove 24, as shown in the following FIGS. 12 to 14 in detail.

Figure 12:
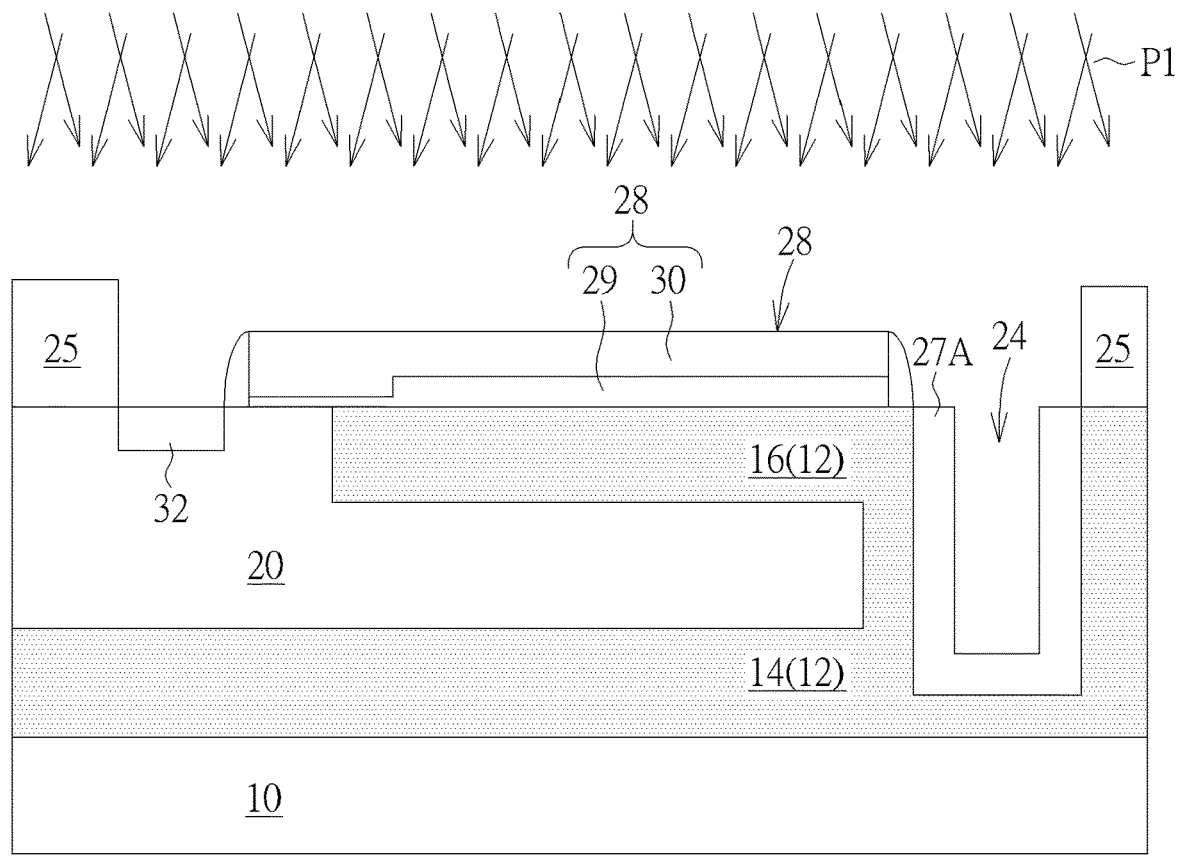
FIGS. 12-14 show schematic structural diagrams of a RESURF LDMOS according to another embodiment of the present invention.

As shown in FIG. 12, in this embodiment, after the groove 24 is formed (following the steps of FIG. 1 and FIG. 2 of the first embodiment), a photoresist layer 25 is formed to cover part of the first well region 12 and the second well region 20, and expose part of the first well region 12 and the second well region 20 at the same time. The exposed region includes the groove 24 and the position of the second well region 20 where the source doped region 32 is to be formed. Then, a doping step P1 is performed to dope the area not covered by the photoresist layer 25. In this embodiment, high-concentration N-type ions are taken as an example, but other embodiments of the present invention may also dope high-concentration P-type ions, and the present invention is not limited thereto. In addition, the groove 24, the source doped region 32, and the gate structure 28 can also be individually and independently doped with different masks, and the present invention is not limited thereto.

It is worth noting that the doping angle can be adjusted during the ion doping step P1 in this embodiment, for example, doping is performed in an oblique direction, so that the doped ions can go deep into the bottom surface and sidewall of the groove 24, and a deep drain doped region 27A is formed on the bottom surface and sidewall of the groove 24. Unlike the deep drain doped region 27 mentioned in the previous embodiment, the deep drain doped region 27A in this embodiment has a U-shaped profile because it is formed on the periphery of the groove 24 of the first well region 12 by ion doping, and the material of the deep drain doped region 27A is the same as that of the first well region 12, and both of them are single crystal silicon. In addition, in this embodiment, the deep drain doped region 27A is formed, and at the same time, the source doped region 32 can be formed in the second well region 20, so that steps can be saved. In addition, the groove 24 can also be doped by plasma doping, and the present invention is not limited thereto.

Figure 13:
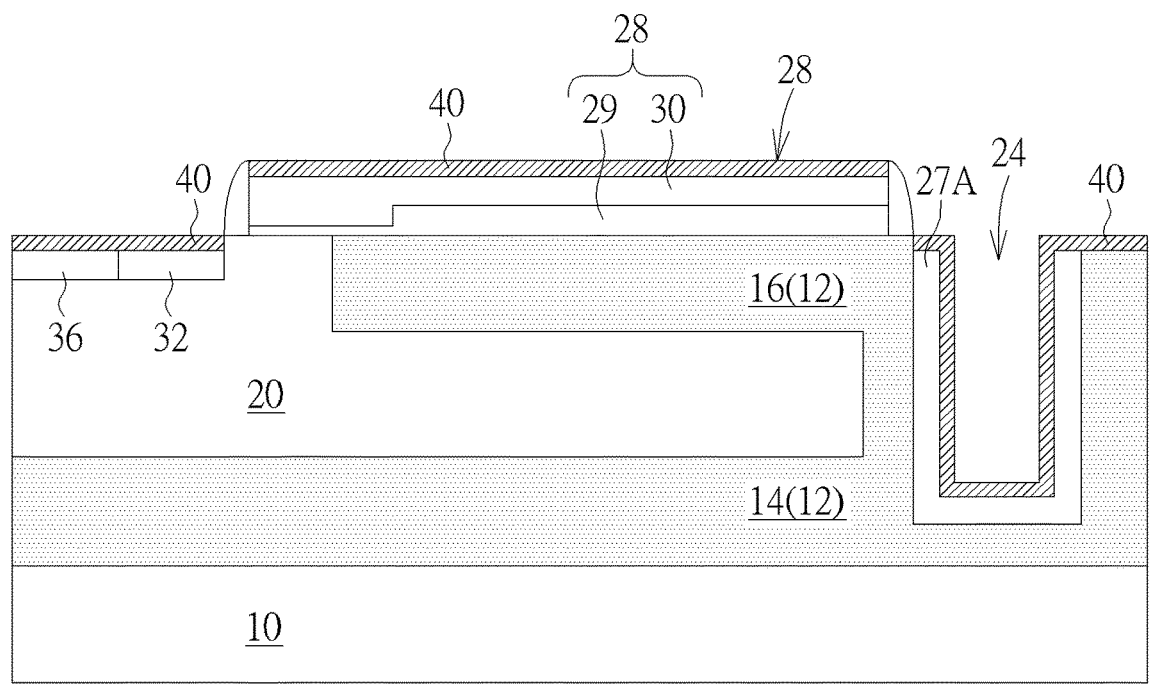

Then, as shown in FIG. 13, the photoresist layer 25 is removed, and then a body region 36 is formed beside the source doped region 32, where the body region 36 is, for example, a P-type doped region formed by doping. Then, a silicide layer 40 is formed, the silicide layer 40 covers the surfaces of the gate structure 28, the first well region 12, the second well region 20 and the groove 24 (i.e., the deep drain doped region 27A). In addition, the present invention does not need to form a silicide layer, or the silicide layer can be selectively formed on the substrate, on the gate structure, or on the inner surface of the groove. The present invention is not limited thereto.

Figure 14:
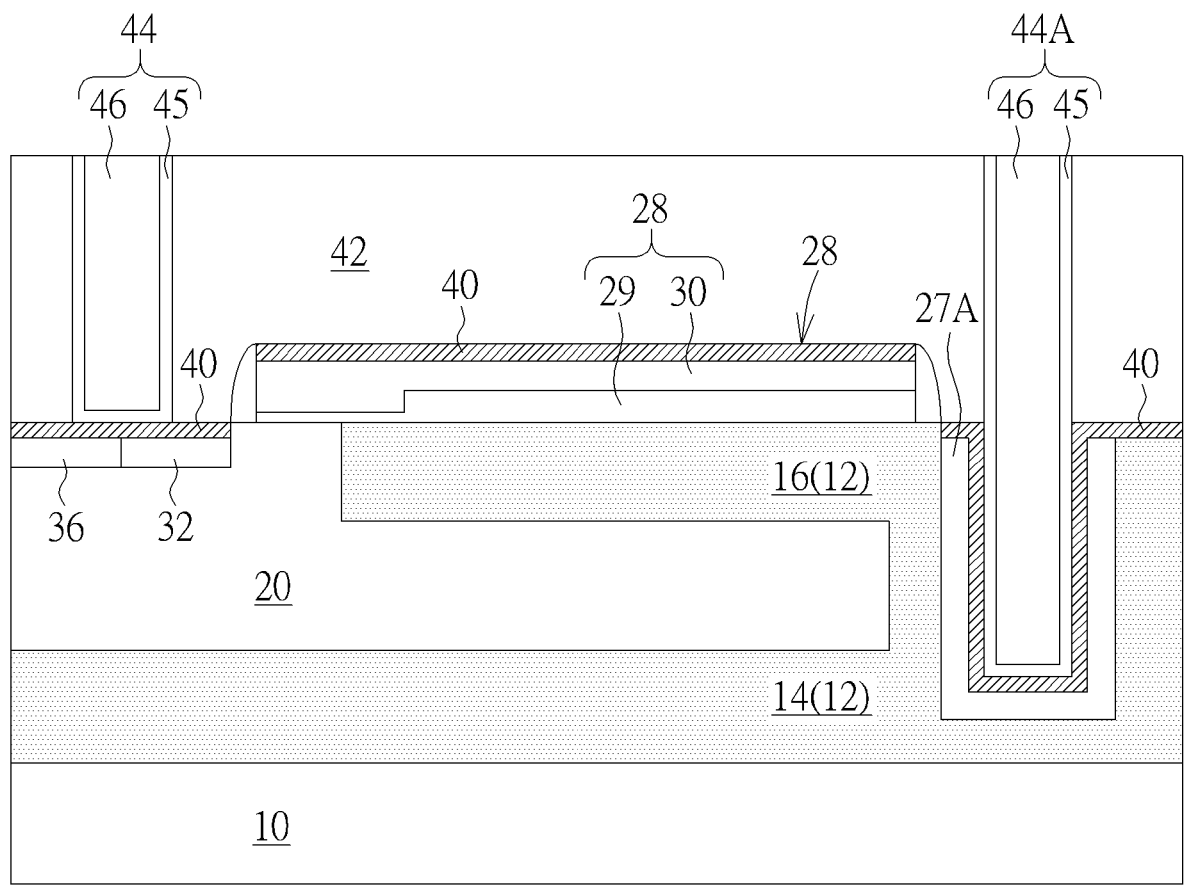

Then, as shown in FIG. 14, a dielectric layer 42, a contact structure 44 and a contact structure 44A are formed. The dielectric layer 42 is, for example, silicon oxide or silicon nitride, and the contact structures 44 and 44A may include a liner layer 45 made of, for example, titanium/titanium nitride, and a conductive layer 46 made of, for example, tungsten (W). Here, the steps for forming the body region 36, the silicide layer 40, and the contact structures 44 and 44A are similar to those of the above embodiments (refer to the description of FIG. 6 and FIG. 7), and will not be repeated here. It should be noted that the contact structure 44A in this embodiment is formed in the groove 24, that is, on the deep drain doped region 27A. The contact structure 44A penetrates into the first well region 12, that is, the bottom surface of the contact structure 44A is lower than the top surface of the first well region 12, so that the current from other elements above can be effectively conducted to the lower part.

Based on the above FIGS. 12 to 14, this embodiment forms the deep drain doped region 27A in another way, which is formed in the groove by doping or ion implantation. The depth of the deep drain doped region is enough to conduct the current from above to below. In another embodiment, the width of the deep drain doped region is also less than 0.5 micrometers, which also has the effect of saving space. In addition, this embodiment is also compatible with the existing process. In addition, in this embodiment, the fabrication of N-type RESURF LDMOS structure is taken as an example, but the type of doping ions can be adjusted to fabricate P-type RESURF LDMOS structure. That is, the method of doping ions in the groove in this embodiment is applied to the embodiment shown in FIG. 9, which also belongs to the scope of the present invention.

According to the above description and drawings, the present invention provides a semiconductor structure including a substrate 10 on which a laterally diffused metal-oxide-semiconductor (LDMOS) device 1 is located, wherein the LDMOS device 1 includes a first well region 12 located on the substrate 10, the first well region 12 has a first conductivity type, a second well region 20 located in the first well region 12, and a part of the upper and lower surfaces of the second well region 20 are surrounded by the first well region 12, wherein the second well region 20 has a second conductivity type which is complementary to the first conductivity type, a source doped region 32 in the second well region 20 with the first conductivity type, and a deep drain doped region (27 or 27A) in the first well region 12 with the first conductivity type. In another embodiment, the width of the deep drain doped region (27 or 27A) is less than 0.5 micrometers.

The invention also provides a method for forming a semiconductor structure, which comprises providing a substrate 10 and forming a laterally diffused metal-oxide-semiconductor (LDMOS) device 1 on the substrate, wherein the step of forming the LDMOS device 1 comprises forming a first well region 12 on the substrate 10, the first well region 12 has a first conductivity type, and a second well region 20 is formed in the first well region 12, and the upper and lower surfaces of a part of the second well region 20 are surrounded by the first well region 12, wherein the second conductivity type is complementary to the first conductivity type, forming a source doped region 32 located in the second well region 20, which has a first conductivity type, and forming a groove 24 in the first well region 12, and filling a doped polysilicon layer 26 in the groove 24 to form a deep drain doped region (27 or 27A) in the first well region 12, wherein the deep drain doped region 27 has the first conductivity type. In another embodiment, the width of the deep drain doped region (27 or 27A) is less than 0.5 micrometers.

In some embodiments, the first well region 12 and the second well region 20 are made of single crystal silicon, while the deep drain doped region 27 is made of polycrystalline silicon, and the shape of the deep drain doped region 27 includes a pillar.

In some embodiments, the materials of the first well region 12, the second well region 20 and the deep drain doped region 27A all comprise single crystal silicon, and the deep drain doped region 27A has a U-shaped profile.

In some embodiments, it further includes a contact structure 44A located on the first well region 12 and electrically connected to the deep drain doped region 27A, wherein a bottom surface of the contact structure 44A is lower than a top surface of the first well region 12.

In some embodiments, a doping concentration of the deep drain doped region 27 is higher than 1E18 cm$^3$.

In some embodiments, it further includes a shallow drain doped region 34 located in the first well region 12 and connected to the deep drain doped region 27.

In some embodiments, the first well region 12 includes a barrier layer 14 and a drift region 16 connected with each other, and part of the second well region 20 is located between the barrier layer 14 and the drift region 16.

In some embodiments, at least one insulating structure 50 is further included beside the deep drain doped region.

In some embodiments, the first conductivity type includes N type and the second conductivity type includes P-type.

In some embodiments, the first conductivity type includes P-type and the second conductivity type includes N-type.

The feature of the present invention is to provide a reduced surface field laterally diffused MOSFET (referred to as RESURF LDMOS for short). In the forming process of the RESURF LDMOS, a groove is formed in a first well region, and then a polysilicon material with high doping concentration is filled in the groove to form a deep drain doped region in the first well region. Different from the conventional way of forming the drain doped region in the first well region by ion implantation and heating diffusion, the required area of the deep drain doped region is significantly reduced, so the total area of the device can also be reduced to achieve the miniaturization effect. In addition, the deep drain doped region has a high doping concentration, which is less likely to generate voltage drop, thus improving the product quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
a substrate;

a laterally diffused metal-oxide-semiconductor (LDMOS) device located on the substrate, wherein the LDMOS device comprises:

a first well region located on the substrate, the first well region having a first conductivity type, wherein the first well region comprises a barrier layer and a drift region connected with each other;

a second well region located in the first well region, wherein upper and lower surfaces of a part of the second well region are surrounded by the first well region, wherein the second well region has a second conductivity type, and the second conductivity type is complementary to the first conductivity type, and part of the second well region is located between the barrier layer and the drift region;

a source doped region located in the second well region, the source doped region having the first conductivity type;

a deep drain doped region located in the first well region, the deep drain doped region having the first conductivity type, wherein a width of the deep drain doped region is less than 0.5 micrometers and a depth of the deep drain doped region is more than 8 micrometers, and a bottom surface of the deep drain doped region is lower than the interface between the barrier layer and the second well region; and a shallow drain doped region located in the first well region, and the shallow drain doped region contacts the deep drain doped region directly, wherein a top surface of the deep drain doped region is aligned with a top surface of the shallow drain doped region.

2. The semiconductor structure according to claim 1, wherein the first well region and the second well region are made of single crystal silicon, and the deep drain doped region is made of polycrystalline silicon, and a shape of the deep drain doped region includes a pillar.

3. The semiconductor structure according to claim 1, wherein the materials of the first well region, the second well region and the deep drain doped region all comprise single crystal silicon, and the deep drain doped region has a U-shaped profile.

4. The semiconductor structure according to claim 3, further comprising a contact structure located on the first well region and electrically connected with the deep drain doped region, wherein a bottom surface of the contact structure is lower than a top surface of the first well region.

5. The semiconductor structure according to claim 1, wherein a doping concentration of the deep drain doped region is higher than 1E18 cm$^3$.

6. The semiconductor structure according to claim 1, further comprising at least one insulating structure located beside the deep drain doped region.

7. The semiconductor structure according to claim 1, wherein the first conductivity type comprises N type and the second conductivity type comprises P type, or the first conductivity type comprises P type and the second conductivity type comprises N type.

* * * * *